US012757333B2

(12) United States Patent
Chen et al.

(10) Patent No.: US 12,757,333 B2
(45) Date of Patent: Oct. 6, 2026

(54) TAPE PROCESSING METHOD

(71) Applicant: CHIPBOND TECHNOLOGY CORPORATION, Hsinchu (TW)

(72) Inventors: Yi-Hui Chen, Hsinchu City (TW); Yi-Hua Huang, Hsinchu City (TW); Yen-Ping Huang, Hsinchu City (TW); Shih-Chieh Chang, Chiayi County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 753 days.

(21) Appl. No.: 18/109,334

(22) Filed: Feb. 14, 2023

(65) Prior Publication Data

US 2023/0380072 A1 Nov. 23, 2023

(30) Foreign Application Priority Data

May 18, 2022 (TW) .................................. 111118594

(51) Int. Cl.
*H05K 3/04* (2006.01)

(52) U.S. Cl.
CPC ..... *H05K 3/041* (2013.01); *H05K 2203/0143* (2013.01); *H05K 2203/0191* (2013.01);
(Continued)

(58) Field of Classification Search
CPC . H01L 21/4857; H01L 23/36; H01L 23/4985; H01L 24/50; H01L 24/79;
(Continued)

(56) References Cited

U.S. PATENT DOCUMENTS 5,765,692 A * 6/1998 Schenz ............... H01L 21/6835 206/460
8,132,673 B1 * 3/2012 Gutentag ............... B65D 73/02 206/460

(Continued)

FOREIGN PATENT DOCUMENTS

JP 57-78161 A 5/1982
JP 10-144724 A 5/1998

(Continued)

OTHER PUBLICATIONS

Japanese Office Action mailed Mar. 18, 2024 for Japanese Patent Application No. 2023-020796, 4 pages.

(Continued)

*Primary Examiner* — Minh N Trinh
(74) *Attorney, Agent, or Firm* — Demian K. Jackson; Jackaon IPG PLLC

(57) ABSTRACT

In a tape processing method, a tape including substrate units is processed by a die device. Each of the substrate units includes a carrier, a circuit layer, an adhesive and a heat spreader which is attached onto the carrier by the adhesive. The die device is provided to press the tape to generate separation protrusions on the heat spreader and allow the separation protrusions to protrude from a heat dissipation surface of the heat spreader. When rolling the tape, the separation protrusions can separate the stacked substrate units to prevent the adhesive from being squeezed out to contaminate the tape.

5 Claims, 6 Drawing Sheets

(52) U.S. Cl.
CPC ................ *H05K 2203/0228* (2013.01); *H05K 2203/0278* (2013.01)

(58) Field of Classification Search
CPC ... H05K 2203/0143; H05K 2203/0191; H05K 2203/0228
See application file for complete search history.

(56) References Cited

U.S. PATENT DOCUMENTS

| | | | | |
|---|---|---|---|---|
| 9,070,739 | B2 * | 6/2015 | Stone | H01L 24/75 |
| 2009/0273076 | A1 | 11/2009 | Choi et al. | |
| 2010/0314637 | A1 | 12/2010 | Kim et al. | |
| 2019/0067072 | A1 * | 2/2019 | Chang | H01L 24/50 |
| 2020/0352067 | A1 | 11/2020 | Varma | |
| 2023/0380072 | A1 * | 11/2023 | Chen | H01L 24/79 |

FOREIGN PATENT DOCUMENTS

| | | | |
|---|---|---|---|
| JP | 11-135576 | A | 5/1999 |
| JP | 2004-259921 | A | 9/2004 |
| JP | 2007-227866 | A | 9/2007 |
| JP | 2010-206072 | A | 9/2010 |
| JP | 2016-143880 | A | 8/2016 |
| TW | I267178 | B | 11/2006 |
| TW | I283447 | B | 7/2007 |
| TW | 201444429 | A | 11/2014 |
| TW | 202115845 | A | 4/2021 |

OTHER PUBLICATIONS

Taiwanese Office Action mailed Apr. 12, 2023 for Taiwanese Patent Application No. 111118594, 4 pages.

Chinese office action mailed May 29, 2026 for Chinese patent application No. 202210646599.0, 9 pages.

* cited by examiner

TAPE PROCESSING METHOD

FIELD OF THE INVENTION

This invention relates to a tape processing method, and more particularly to a tape processing method which is able to prevent adhesive contamination and its manufacturing method.

BACKGROUND OF THE INVENTION

Conventionally printed circuit board tape is rolled and transported to stations for chip bonding, testing and other processes, and a protection tape is provided to protect the printed circuit board tape during rolling. A stress is applied to the printed circuit board tape and the protection tape during rolling, however, the stress may squeeze an adhesive used to adhere a heat spreader onto the printed circuit board tape out of the heat spreader and cause contamination on the printed circuit board tape and the protection tape. Furthermore, another printed circuit board may be contaminated while the protection tape adhered with the adhesive is reused.

SUMMARY

One object of the present invention is to provide a processing method of a tape which is able to prevent contamination of an adhesive used to adhere a heat spreader onto a carrier.

A tape processing method operatively associated with a die device including a punch-cutting element and a plurality of punch-pressing elements located outside the punch-cutting element, the tape processing method includes the following steps: providing a tape including a plurality of substrate units, cutting one of the plurality of substrate units using the punch-cutting element when the substrate unit is defective, and pressing one of the plurality of substrate units using the plurality of punch-pressing elements when the substrate unit is non-defective. Each of the substrate units includes a carrier, a circuit layer, an adhesive and a heat spreader, the circuit layer is located on the carrier, the heat spreader is attached onto the carrier by the adhesive. The carrier includes a to-be-removed portion, the adhesive includes a first to-be-removed portion corresponding to the to-be-removed portion, and the heat spreader includes a second to-be-removed portion corresponding to the to-be-removed portion. The punch-cutting element of the die device is provided to cut one of the plurality of substrate units when the substrate unit is defective. The to-be-removed portion is cut and separated from the carrier, the first to-be-removed portion is cut and separated from the adhesive, and the second to-be-removed portion is cut and separated from the heat spreader. The punch-pressing elements of the die device are provided to press one of the plurality of substrate units to generate a plurality of separation protrusions on the heat spreader when the substrate unit is non-defective. The separation protrusions protrude from a heat dissipation surface of the heat spreader.

A tape of the present invention includes a plurality of substrate units. Each of the substrate units includes a carrier, a circuit layer, an adhesive and a heat spreader, the circuit layer is located on the carrier, the heat spreader is attached onto the carrier by the adhesive and includes a plurality of separation protrusions which protrude from a heat dissipation surface of the heat spreader.

In the present invention, the separation protrusions are formed on the heat spreader in the cutting and/or pressing process. While rolling the tape with a protection tape, the separation protrusions are provided to separate the stacked tapes so as to prevent the adhesive from being moved out to contaminate the tape and the protection tape.

DETAILED DESCRIPTION OF THE INVENTION

Figure 1:
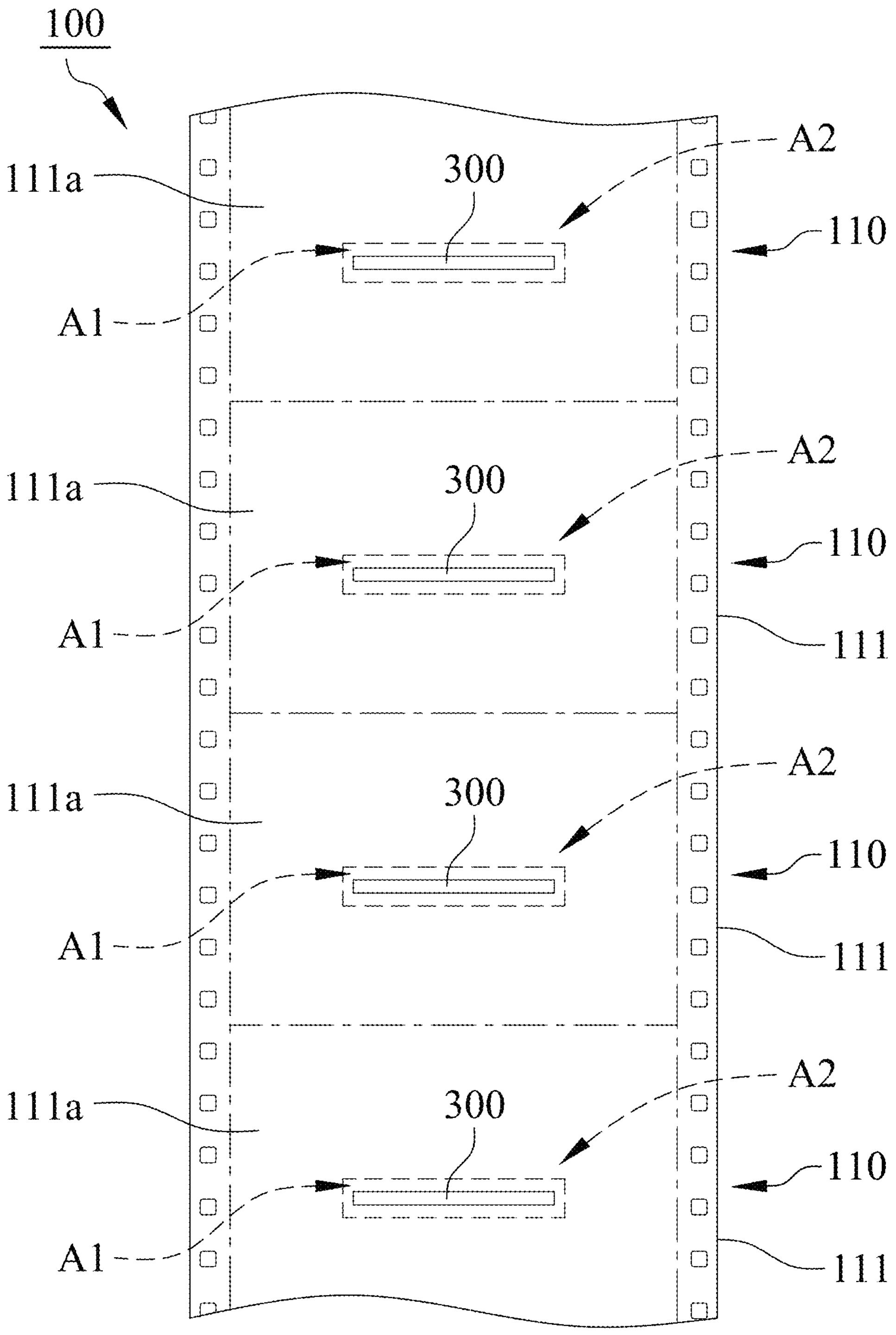
FIG. 1 is a top view diagram illustrating a tape in accordance with one embodiment of the present invention.
Figure 2:
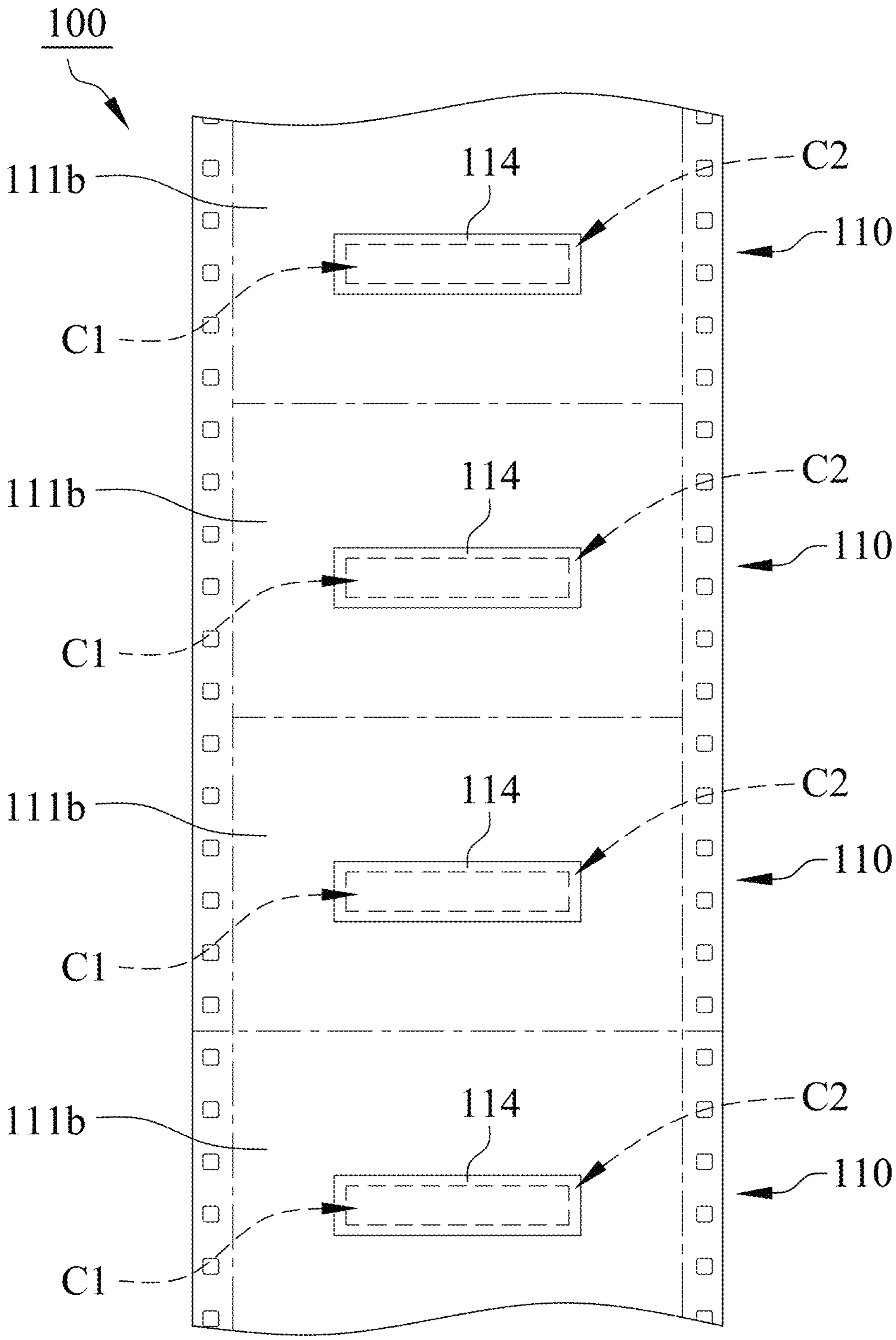
FIG. 2 is a bottom view diagram illustrating a tape in accordance with one embodiment of the present invention.
Figure 3:
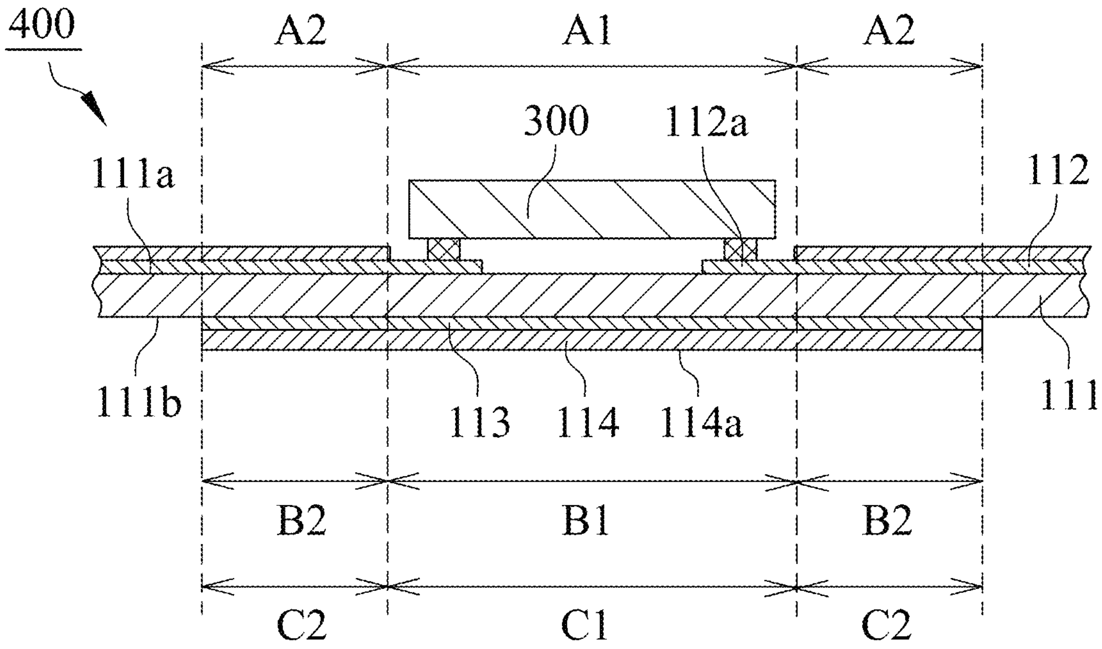
FIG. 3 is a cross-section view diagram illustrating a chip-mounted unit of a tape in accordance with one embodiment of the present invention.
Figure 9:
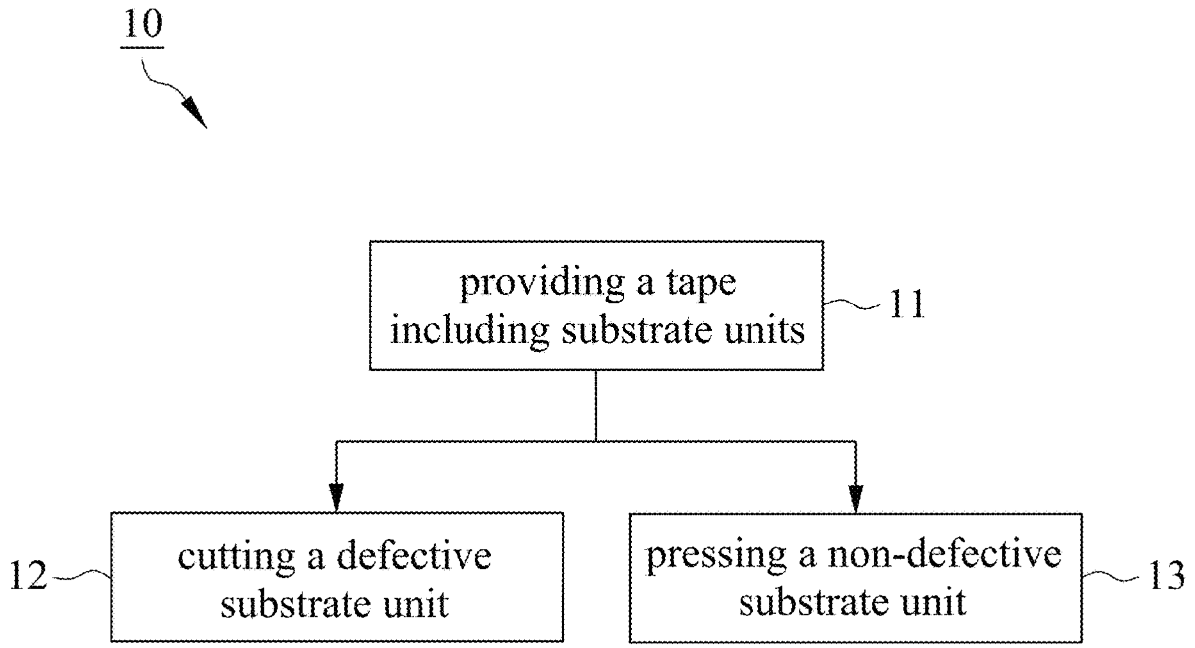
FIG. 9 is a flowchart illustrating a tape processing method in accordance with one embodiment of the present invention.

With reference to FIG. 9, a tape processing method 10 in accordance with one embodiment of the present invention includes a step 11 of providing a tape including substrate units, a step 12 of cutting a defective substrate unit and a step 13 of pressing a non-defective substrate unit. With reference to FIGS. 1 to 3, a tape 100 includes a plurality of substrate units 110, and in this embodiment, electronic components, such as chips, can be mounted on the substrate units 110 respectively. Each of the substrate units 110 includes a carrier 111, a circuit layer 112, an adhesive 113 and a heat spreader 114. The circuit layer 112 is located on a top surface 111*a* of the carrier 111 and includes a plurality of inner leads 112*a*. The heat spreader 114 is adhered on a bottom surface 111*b* of the carrier 111 by the adhesive 113, and it has a heat dissipation surface 114*a* which is exposed. In this embodiment, a chip-mounted unit 400 can be obtained after bonding a chip 300 to the inner leads 112*a* of each of the substrate units 110. Preferably, a underfill material (not shown) can be provided between the chip 300 and the inner leads 112*a*.

With reference to FIGS. 1 to 3, in this embodiment, the carrier 111 includes a to-be-removed portion A1 where the inner leads 112*a* are located on, the adhesive 113 includes a first to-be-removed portion B1 corresponding to and located below the to-be-removed portion A1 of the carrier 111, and the heat spreader 114 includes a second to-be-removed portion C1 corresponding to and located below the to-be-removed portion A1 of the carrier 111. If the chip-mounted unit 400 or the substrate unit 110 is referred to as a defective product, the to-be-removed portion A1, the first to-be-removed portion B1 and the second to-be-removed portion C1 will be removed in the cutting and/or pressing process. On the other hand, the to-be-removed portion A1, the first to-be-removed portion B1 and the second to-be-removed portion C1 will not be removed in the cutting and/or pressing process and will be rolled with the tape 100 for the next process when the chip-mounted unit 400 or the substrate unit 110 is referred to as a non-defective product.

Figure 4:
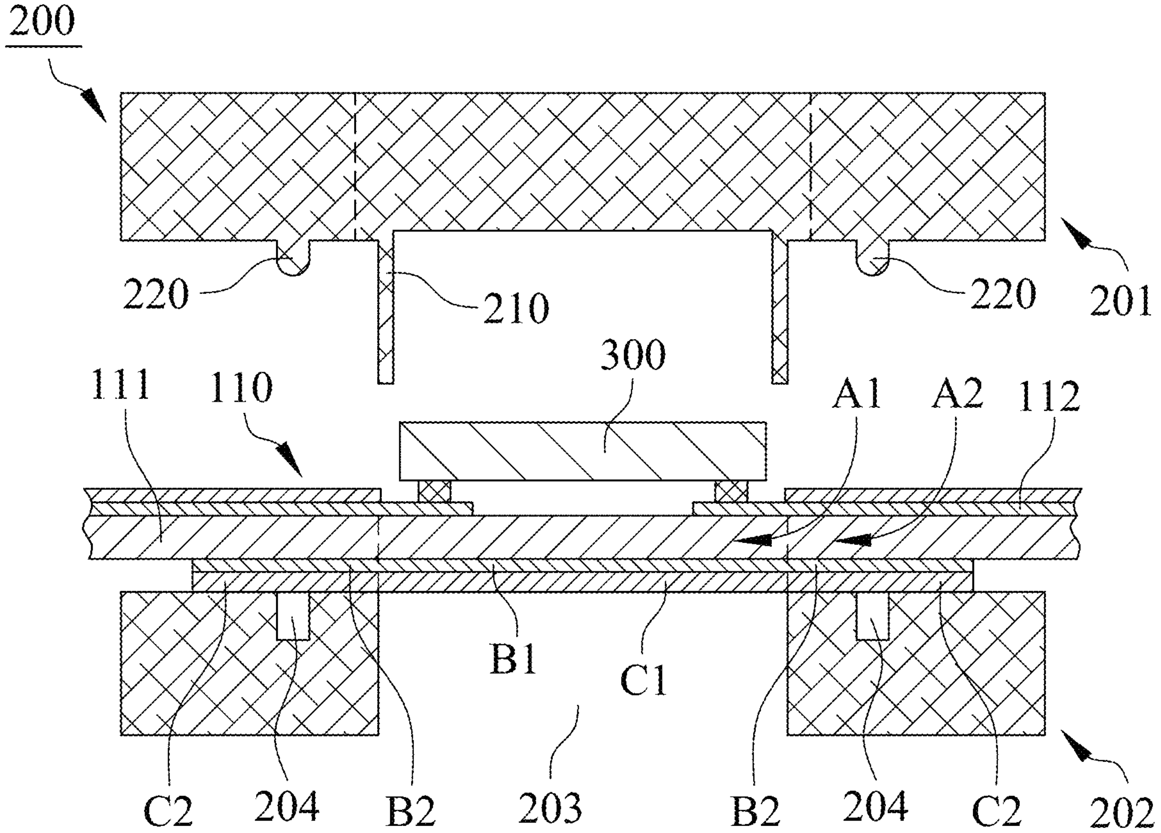
FIG. 4 is a cross-section view diagram illustrating a die device and a chip-mounted unit of a tape in accordance with one embodiment of the present invention.

With reference to FIGS. 3 and 4, the die device 200 includes a plurality of punch-pressing elements 220, and preferably, the die device 200 further includes a punch-cutting element 210, the punch-pressing elements 220 are located outside the punch-cutting element 210. In this embodiment, the punch-cutting element 210 and the punch-pressing elements 220 are arranged on an upper die 201 of the die device 200, and a die opening 203 corresponding to the punch-cutting element 210 and die cavities 204 corresponding to the punch-pressing elements 220 are arranged on a lower die 202 of the die device 200. The punch-cutting element 210 and the punch-pressing elements 220 can be moved together or moved individually, and the present invention does not limit the operation and formation of the die device 200.

With reference to FIGS. 3 to 6, the punch-cutting element 210 is provided to cut the to-be-removed portion A1 of the carrier 111, the first to-be-removed portion B1 of the adhesive 113 and the second to-be-removed portion C1 of the heat spreader 114 in the cutting and/or pressing process while the chip-mounted unit 400 or the substrate unit 110 is referred to as a defective product. Thus, the to-be-removed portion A1 is separated from the carrier 111, the first to-be-removed portion B1 is separated from the adhesive 113, and the second to-be-removed portion C1 is separated from the heat spreader 114. The chip 300 and the inner leads 112*a* of the circuit layer 112 are also removed together with the to-be-removed portion A1 by the punch-cutting element 210. After the cutting and/or pressing process, there are a reserve portion A2 and an opening A3 on the cut carrier 111, a first reserve portion B2 and a first opening B3 on the cut adhesive 113, and a second reserve portion C2 and a second opening C3 on the cut heat spreader 114. The reserve portion A2 is located outside the opening A3, the first reserve portion B2 is located outside the first opening B3, and the second reserve portion C3 is located outside the second opening C3. The opening A3, the first opening B3 and the second opening C3 are referred as a hollow portion 110*a* of the substrate unit 110. In the cutting and/or pressing process, the punch-pressing elements 220 are provided to press the reserve portion A2 of the carrier 111, the first reserve portion B2 of the adhesive 113 and the second reserve portion C2 of the heat spreader 114 to generate a plurality of separation protrusions C4 on the second reserve portion C2 of the heat spreader 114. The separation protrusions C4 are located outside the second opening C3 and protrude from the heat dissipation surface 114*a* of the heat spreader 114.

Figure 5:
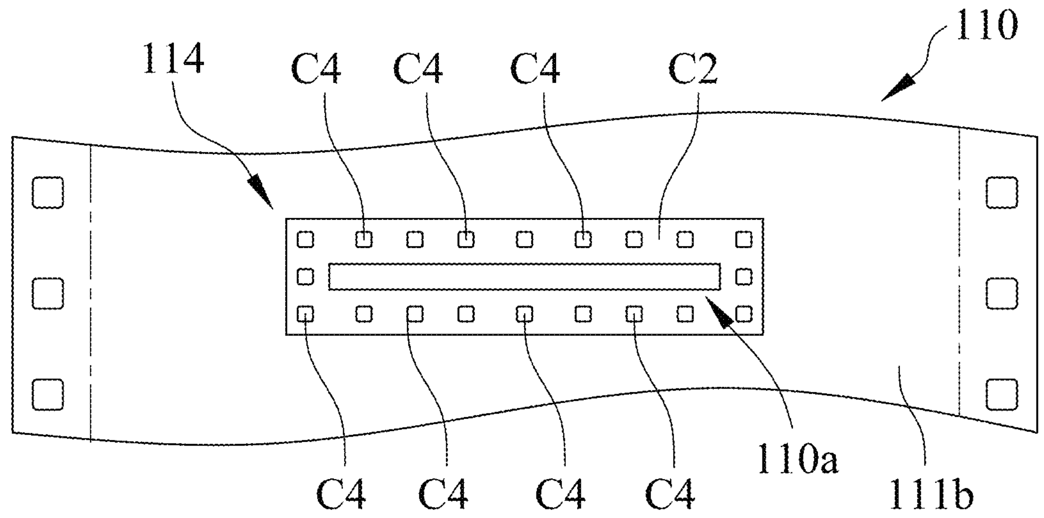
FIG. 5 is a bottom view diagram illustrating a tape in accordance with one embodiment of the present invention.
Figure 6:
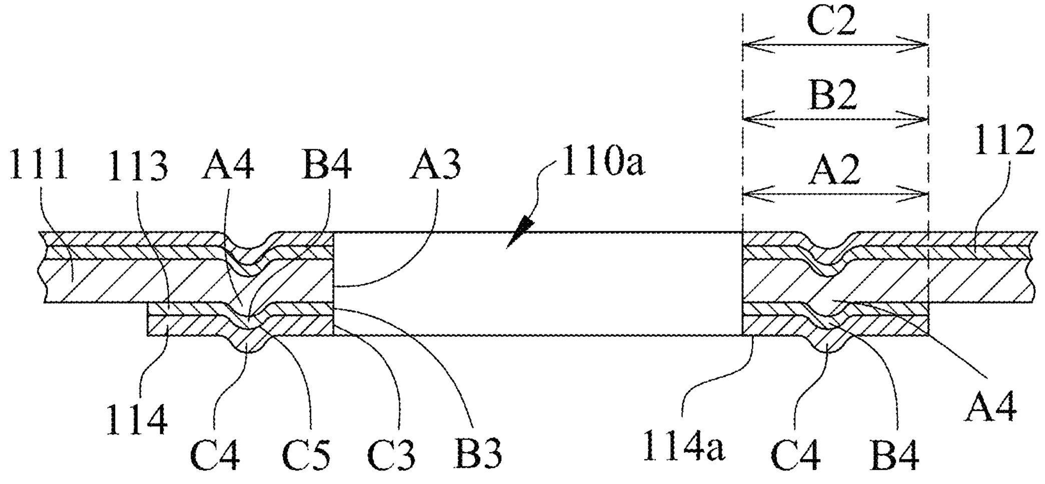
FIG. 6 is a cross-section view diagram illustrating a tape in accordance with one embodiment of the present invention.

With reference to FIGS. 4 to 6, in this embodiment, a plurality of first restriction protrusions B4 are formed on the first reserve portion B2 of the adhesive 113 after the reserve portion A2 of the carrier 111 is pressed by the punch-pressing elements 220, and each of the first restriction protrusions B4 is located within a restriction recess C5 of each of the separation protrusions C4. The first restriction protrusions B4 located within the restriction recesses C5 can hold the first reserve portion B2 of the adhesive 113 as the first to-be-removed portion B1 of the adhesive 113 is removed by the punch-cutting element 210, thus the first reserve portion B2 of the adhesive 113 will not be pulled and moved to the hollow portion 110*a* by the punch-cutting element 210.

With reference to FIGS. 4 to 6, preferably, a plurality of restriction protrusions A4 are formed on the reserve portion A2 of the carrier 111 after the reserve portion A2 is pressed by the punch-pressing elements 220. The restriction protrusions A4 are inserted into the first reserve portion B2 of the adhesive 113 such that the first restriction protrusions B4 of the adhesive 113 are clamped between the restriction protrusions A4 of the carrier 111 and the separation protrusions C4 of the heat spreader 114. The clamping force applied on the first reserve portion B2 of the adhesive 113 by the reserve portion A2 of the carrier 111 and the second reserve portion C2 of the heat spreader 114 can prevent the first reserve portion B2 of the adhesive 113 from being pulled by the punch-cutting element 210 and moved to the hollow portion 110*a* of the substrate unit 110.

Figure 7:
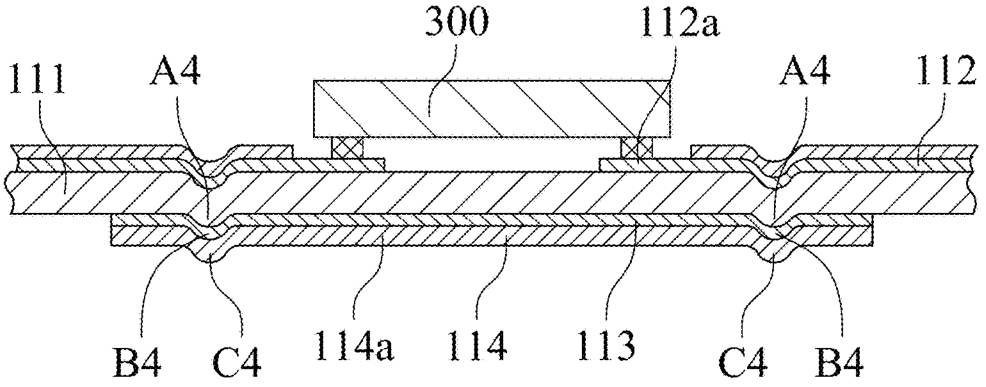
FIG. 7 is a cross-section view diagram illustrating a tape in accordance with one embodiment of the present invention.

With reference to FIGS. 4 and 7, when the chip-mounted unit 400 or the substrate unit 110 is recognized as an acceptable product, the chip 300, the inner leads 112*a*, the to-be-removed portion A1 of the carrier 111, the first to-be-removed portion B1 of the adhesive 113 and the second to-be-removed portion C1 of the heat spreader 114 will not be removed. Only the punch-pressing elements 220 of the die device 200 are used to press the carrier 111, the adhesive 113 and the heat spreader 114 of the tape 100 in the cutting and/or pressing process to generate the separation protrusions C4 protruding from the heat dissipation surface 114*a* of the heat spreader 114. Preferably, the first restriction protrusions B4 corresponding to the restriction recesses C5 are also formed on the adhesive 113 in the cutting and/or pressing process, and more preferably, the restriction protrusions A4 inserted into the first reserve portion B2 of the adhesive 113 are formed on the carrier 111 in the cutting and/or pressing process.

Figure 8:
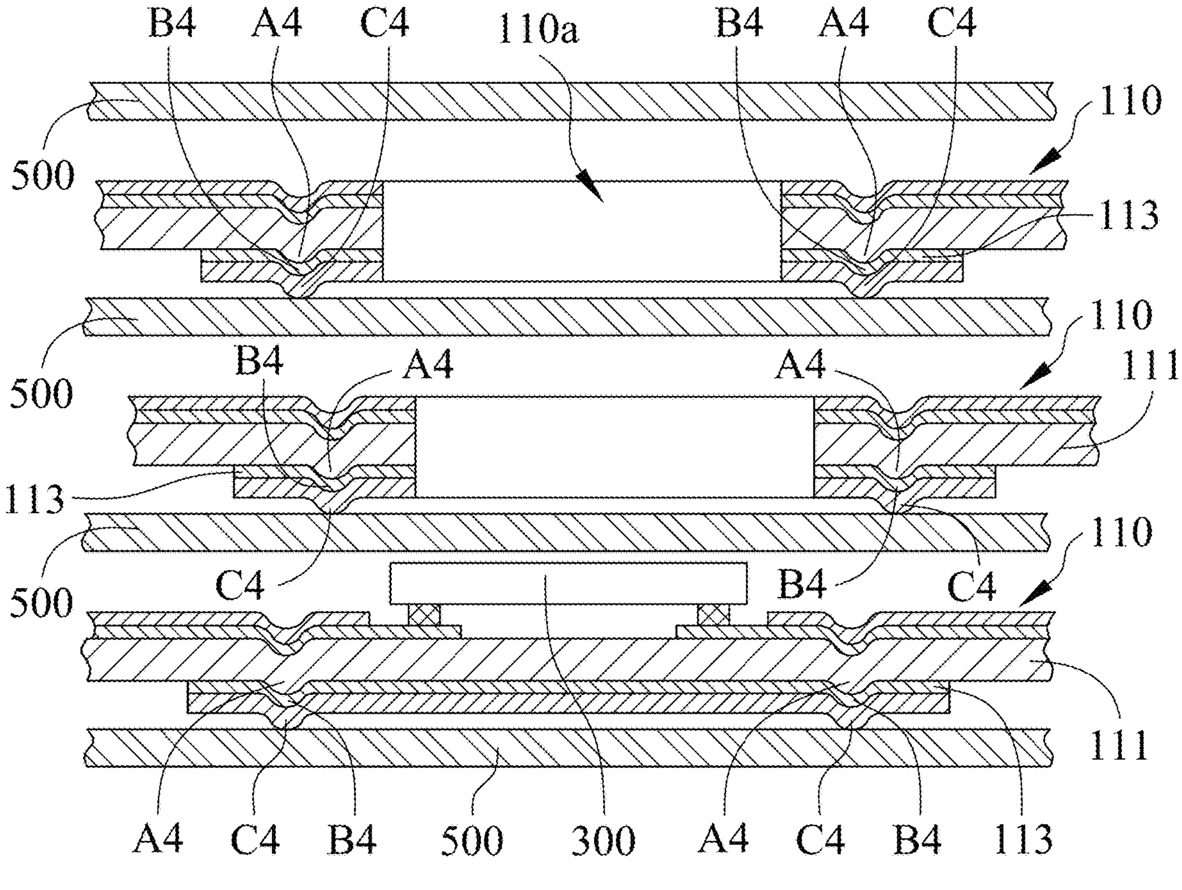
FIG. 8 is a cross-section view diagram illustrating a tape in accordance with one embodiment of the present invention.

With reference to FIGS. 6 to 8, after the cutting and/or pressing process, the tape 100 is rolled on a roll (not shown) and a protection tape 500 is provided to separate the rolled and stacked tape 100. The separation protrusions C4 on the tape 100 contact the protection tape 500 located under the tape 100 to prevent the adhesive 113 from being squeezed out. The protection tape 500 and the tape 100 are protected from contamination of the adhesive 113. Additionally, a plurality of protrusions (not shown) may be provided on the protection tape 500 to contact the substrate unit 110 and avoid the protection tap 500 from pressing the hollow portion 110*a* of the substrate unit 110 or the chip 300.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A tape processing method operatively associated with a die device including a punch-cutting element and a plurality of punch-pressing elements located outside the punch-cutting element, the tape processing method comprising steps of:

providing a tape including a plurality of substrate units, each of the plurality of substrate units includes a carrier, a circuit layer located on the carrier, an adhesive, and a heat spreader adhered on the carrier by the adhesive, wherein the carrier includes a first to-be-removed portion, the adhesive includes a second to-be-removed portion corresponding to the first to-be-removed portion, and the heat spreader includes a third to-be-removed portion corresponding to the first to-be-removed portion;

cutting one of the plurality of substrate units using the punch-cutting element when the substrate unit is defective, wherein the first to-be-removed portion is cut and separated from the carrier, the second to-be-removed portion is cut and separated from the adhesive, and the third to-be-removed portion is cut and separated from the heat spreader; and pressing one of the plurality of substrate units using the plurality of punch-pressing elements to generate a plurality of separation protrusions on the heat spreader when the substrate unit is not defective, wherein the plurality of separation protrusions protrude from a heat dissipation surface of the heat spreader.

2. The tape processing method in accordance with claim 1, wherein the cut carrier includes a first opening and a first reserve portion located outside the first opening, the cut adhesive includes a second opening and a second reserve portion located outside the second opening, and the cut heat spreader includes a third opening and a third reserve portion located outside the third opening, the first opening of the carrier, the second opening of the adhesive and the third opening of the heat spreader are each a hollow portion of each of the plurality of substrate units, the first reserve portion of the carrier, the second reserve portion of the adhesive and the third reserve portion of the heat spreader are pressed by the plurality of punch-pressing elements to generate the plurality of separation protrusions on the third reserve portion of the heat spreader, the plurality of separation protrusions are located outside the third opening of the heat spreader.

3. The tape processing method in accordance with claim 2, wherein the second reserve portion of the adhesive is pressed by the plurality of punch-pressing elements to generate a plurality of second restriction protrusions on the second reserve portion of the adhesive, each of the second restriction protrusions is located in a restriction recess of each of the plurality of separation protrusions.

4. The tape processing method in accordance with claim 3, wherein the first reserve portion of the carrier is pressed by the plurality of punch-pressing elements to generate a plurality of first restriction protrusions on the first reserve portion of the carrier and the plurality of first restriction protrusions are inserted into the second reserve portion of the adhesive.

5. The tape processing method in accordance with claim 2, wherein the circuit layer includes a plurality of inner leads which are located on the first to-be-removed portion of the carrier, the plurality of inner leads and a chip bonded to the plurality of inner leads removed together with the first to-be-removed portion of the carrier by the punch-cutting element.

* * * * *